(12) United States Patent
Galera et al.

(10) Patent No.: US 8,314,480 B2
(45) Date of Patent: Nov. 20, 2012

(54) STACKABLE SEMICONDUCTOR PACKAGE WITH EMBEDDED DIE IN PRE-MOLDED CARRIER FRAME

(75) Inventors: Manolito Fabres Galera, Singapore (PH); Leocadio Morona Alabin, Singapore (PH); In Suk Kim, Singapore (PH)

(73) Assignee: Fairchild Semiconductor Corporation, San Jose, CA (US)

( * ) Notice: Subject to any disclaimer, the term of this patent is extended or adjusted under 35 U.S.C. 154(b) by 507 days.

(21) Appl. No.: 12/701,773

(22) Filed: Feb. 8, 2010

(65) Prior Publication Data

US 2011/0193206 A1 Aug. 11, 2011

(51) Int. Cl.
*H01L 23/02* (2006.01)

(52) U.S. Cl. ........ 257/678; 257/686; 257/685; 257/700; 257/734

(58) Field of Classification Search .................. 257/678, 257/686, 685, 700, 734
See application file for complete search history.

(56) References Cited

U.S. PATENT DOCUMENTS

| | | | |
|---|---|---|---|
| 6,577,000 B2 | 6/2003 | Sato et al. | |
| 6,770,961 B2 | 8/2004 | Lee | |
| 2006/0208363 A1* | 9/2006 | Shiu et al. | 257/777 |
| 2008/0277802 A1* | 11/2008 | Tsai et al. | 257/778 |
| 2009/0072374 A1* | 3/2009 | Dobritz et al. | 257/686 |
| 2009/0294945 A1* | 12/2009 | Okada et al. | 257/686 |

OTHER PUBLICATIONS

U.S. Appl. No. 12/645,075, filed Dec. 22, 2009, England et al.
U.S. Appl. No. 12/271,369, filed Nov. 14, 2008, Liu.

* cited by examiner

*Primary Examiner* — Jae Lee
(74) *Attorney, Agent, or Firm* — Kenneth E. Horton; Kirton McConkie, PC

(57) ABSTRACT

Semiconductor packages that contain multiple stacked chips that are embedded in a pre-molded carrier frame and methods for making such semiconductor packages are described. The semiconductor packages contain a full land pad array and multiple chips that are stacked vertically. The land pad array contains inner terminals that are formed by first stud bumps that are located on a lower die. The land pad array also contains middle terminals that are formed by first conductive vias in a first molding layer embedding the first die. The first conductive vias are connected to second stud bumps that are located on a second die that is embedded in a second molding layer. The second molding layer contains second conductive vias that are connected to a carrier frame, the bottom of which forms the outer terminals of the land pad array. The semiconductor packages therefore have a high input/output capability with a small package footprint, and a flexible routing capability that are especially useful for portable and ultra-portable electronic apparatus. Other embodiments are also described.

20 Claims, 6 Drawing Sheets

US 8,314,480 B2

STACKABLE SEMICONDUCTOR PACKAGE WITH EMBEDDED DIE IN PRE-MOLDED CARRIER FRAME

FIELD

This application relates generally to semiconductor devices and methods for making such devices. More specifically, this application describes semiconductor packages that contain multiple, stacked chips that are embedded in a pre-molded carrier frame and methods for making such semiconductor packages.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to semiconductor packages that contain multiple stacked chips that are embedded in a pre-molded carrier frame and methods for making such semiconductor packages. The semiconductor packages contain a full land pad array and multiple chips that are stacked vertically. The land pad array contains inner terminals that are formed by first stud bumps that are located on a lower die. The land pad array also contains middle terminals that are formed by first conductive vias in a first molding layer embedding the first die. The first conductive vias are connected to second stud bumps that are located on a second die that is embedded in a second molding layer. The second molding layer contains second conductive vias that are connected to a carrier frame, the bottom of which forms the outer terminals of the land pad array. The semiconductor packages therefore have a high input/output capability with a small package footprint, and a flexible routing capability that are especially useful for portable and ultra-portable electronic apparatus.

BRIEF DESCRIPTION OF THE DRAWINGS

The following description can be better understood in light of the Figures, in which.

Figure 1:
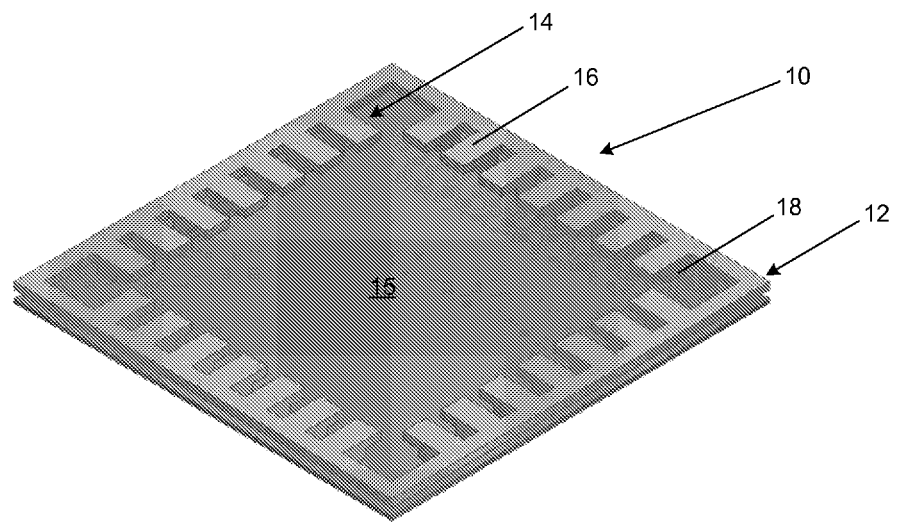
FIG. 1 shows some embodiments of a method for making semiconductor packages containing a carrier frame and a tape.

The Figures illustrate specific aspects of the semiconductor packages and methods for making such packages. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of making and using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor packages in the IC industry, it could be used in and applied to other electronic devices like optoelectronic devices, solar cells, MEMS structures, lighting controls, power supplies, and amplifiers.

Some embodiments of the semiconductor packages and methods for making such packages are shown in FIGS. 1-11. In these embodiments, the methods for making the semiconductor packages begin by providing a carrier frame (or frame) 10, as shown in FIG. 1. The carrier frame 10 can be any frame that is conductive and can support the process requirements described herein, as well as any frame that can be made from commonly known materials such as copper or iron or steel-based metals. The carrier frame 10 can be manufactured by any known process, such as a stamping or etching process.

The carrier frame 10 can have any size and thickness that is needed to operate as a support substrate during the manufacturing process and as operates as lands and/or terminals of the final package. Thus, the size and thickness of the carrier frame 10 will depend on the size and density of the semiconductor package, as well as the semiconductor die (or dies) that will be contained in the semiconductor package. The carrier frame 10 can comprise any metal or metal alloy known in the art, including Cu, steel alloy, or stainless steel sheets, or combinations thereof. In some embodiments, the frame 10 comprises Cu or steel alloy. In other embodiments, the carrier frame can comprise non-metal conductive materials that can withstand molding temperature and have the required physical strength to support the components of the semiconductor package.

The carrier frame 10 can have any desired shape providing the final semiconductor package with the desired features. In some embodiments, the carrier frame 10 can have the shape shown in FIG. 1 with an substantially-rectangular, outer portion 12 and an inner portion 14 comprising members 16 that extend inward from the outer portion 12 and that have an extended bottom portion 18.

As shown in FIG. 1, a tape 15 can then be provided on the carrier frame 10. The tape 15 is supported by the carrier frame 10 and so can be made of a flexible or a semi-flexible material. As well, once the semiconductor package is formed, the tape 15 can be removed from the carrier frame 10. So the tape 15 can be made of any material that is partially adhesive, but can be removed when molding process is complete or when it is peeled off. Any material having these characteristics can be used in the tape 15, including polyimide, silicone-free tape, or other thin-film materials. While the width and length of the tape 15 can be substantially similar to that of the carrier frame 10, the thickness of the tape 15 can be more or less than the thickness of the carrier frame 10.

Figure 2:
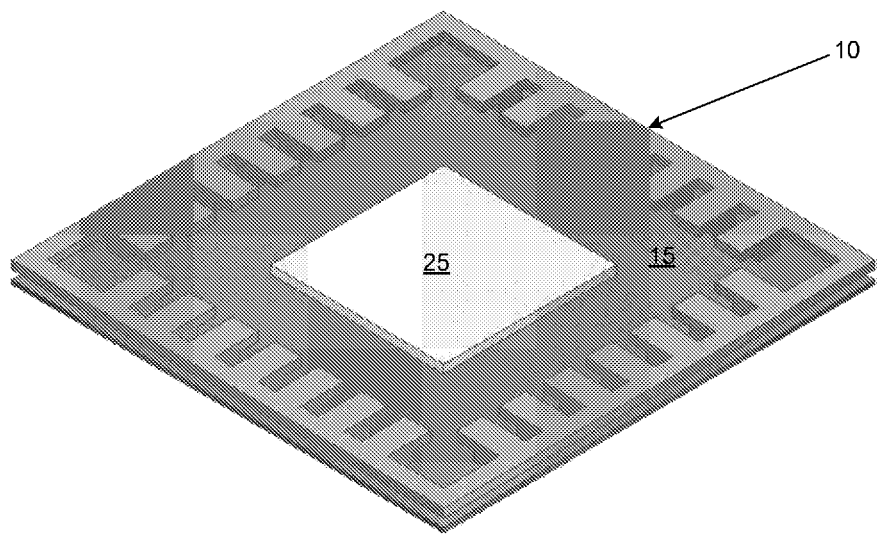
FIG. 2 depicts some embodiments of a method for making semiconductor packages containing a first die.

As shown in FIG. 2, a first semiconductor die 25 (or die) containing an IC device(s) is disposed on the tape 15. The first die 25 may be made of any suitable semiconductor material. Some non-limiting examples of such materials may include silicon, polysilicon, gallium arsenide, silicon carbide, gallium nitride, silicon and germanium, and combinations thereof.

The first die 25 can contain any number of IC devices. The IC device(s) may be any known integrated circuit in the art. Some non-limiting examples of these devices may include logic or digital IC device, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET").

In some embodiments, any known flipchip process can be used to attach the first die 25 to the tape 15. In these embodiments, the IC device(s) on the first die 25 can be provided with a bond pad as known in the art. In some embodiments, the bond pads (not shown in the Figures) can be provided in those areas that overlay the IC device(s). The bond pads can be formed in the desired location by any process known in the art (such as a redistribution method) and can be made of any known solderable material, including Au, Cu, Ag, Ti, Ni, Sn, W, Ni, or combinations thereof.

An array of first stud bumps 20 (or pillars) can then be provided on the bond pads. The first bumps 20 can be made of conductive material such as Ag, Sn, Pb, Cu, Sb, Au or combinations thereof. The first bumps 20 can be provided on the bond pads through any process known in the art, including electroless plating, ball drop, or printing. Then, the first die 25 is flipped and placed on the tape 15 so that the first bumps 20 contact the tape 15 (as shown in the side view of FIG. 6).

Figure 3:
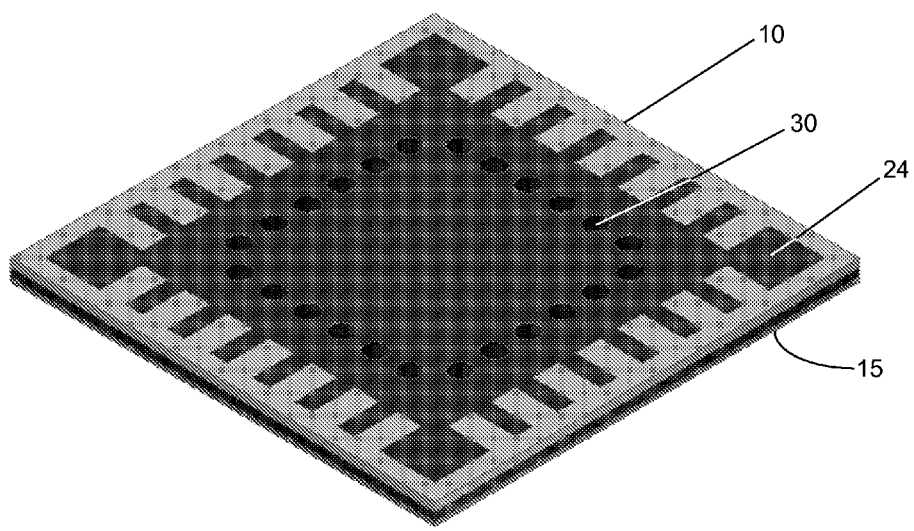
FIG. 3 shows some embodiments of a method for making semiconductor packages containing a first molding layer with first via holes.

As shown in FIG. 3, a first (or pre-molding) layer 24 can then be provided on the tape 15, around the first die 25, and the first bumps 20 except for those portions of the first bumps 20 contacting the tape 15. The pre-molding layer 24 can be made of any material known in the art, such as an epoxy molding compound, a thermoset resin, a thermoplastic material, or a potting material. The pre-molding layer 24 can be provided in any manner known in the art such as transfer molding or compression molding. In some embodiments, such as where the pre-molding layer is made of potting material, it can be deposited on the tape 15 and around the carrier frame 10 by dispensing and then planarizing by any physical action until the upper surfaces of the carrier frame 10 is exposed, as shown in FIG. 3.

During the process of forming the first molding layer 24, first via holes 30 can be provided by any process that provides the first via holes 30 in the desired locations of the first molding layer 24. In some embodiments, the first via holes 30 can be mold tool-defined and formed during the molding process when making the first molding layer 24. The mold tool can be designed and fabricated with embossed features in the mold cavity to form the via holes 30. In other embodiments, the first via holes 30 can be provided after the pre-molding layer 24 is formed by using any process known in the art, such as a masking and etching process, a laser drilling process, or a pre-formed process performed during molding according the mold cavity design.

Figure 4:
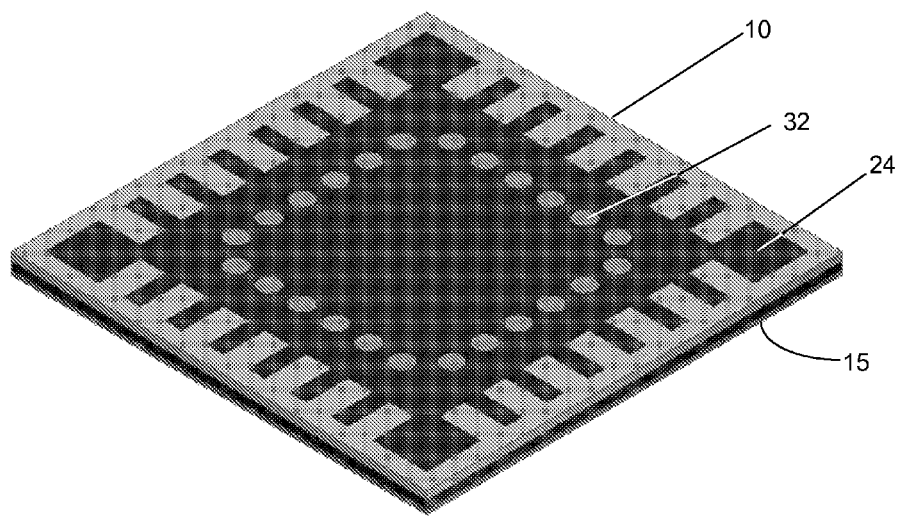
FIGS. 4 and 5 show top and bottom views of some embodiments of a method for making semiconductor packages containing first conductive vias formed in the first molding layer.

Next, the first via holes 30 can be filled as shown in FIG. 4. The via holes can be filled with any conductive material known in the art, including Ag, Sn, Pb, Cu, Sb, Au, or combinations thereof. The first via holes 30 can be filled using any process known in the art, including a deposition of the conductive material followed by a planarization process until the upper surface of the first molding layer 24 is reached. As shown in the top view depicted in FIG. 4, the resulting first conductive vias 32 have been created in the via holes 30 in the first molding layer 24.

Figure 5:
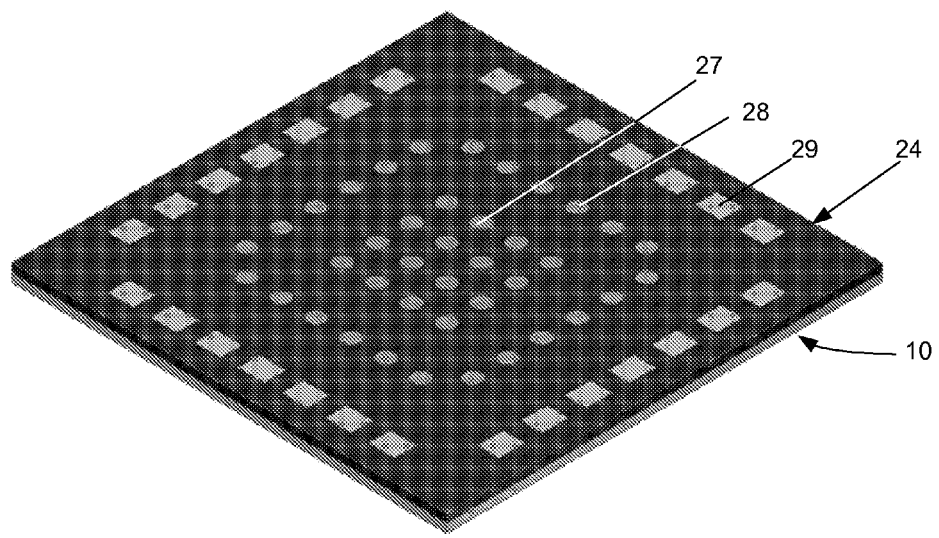
Figure 6:
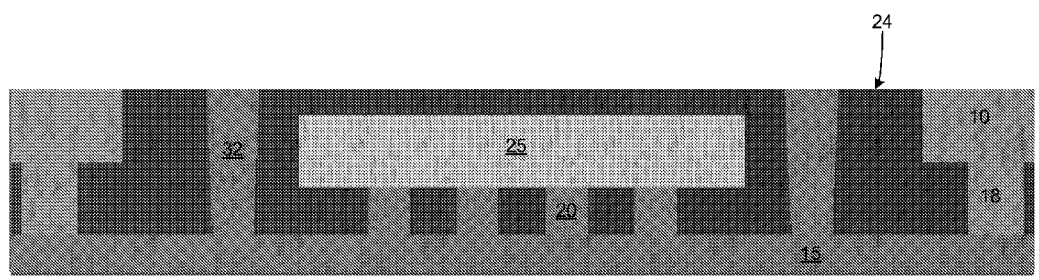
FIG. 6 depicts a side view of some embodiments of a method for making semiconductor packages containing first conductive vias formed in the first molding layer.

A bottom view of the resulting structure (without the tape 15 shown) is depicted in FIG. 5. The bottom of the structure contains the bottom of the first molding layer 24, outer terminals 29, middle terminals 28, and inner terminals 27. The outer terminals 29 are formed from the extended bottom portion 18 of the carrier frame 10. The middle terminals 28 are formed from first conductive vias 32 that have been formed in the first via holes 30. And the inner terminals are formed from the first bumps 20 that have been formed on the bond pads of the first die 25. In some embodiments, the outer terminals 29 can be isolated for stacking of other semiconductor packages or electronic devices. A side view of the structure depicted in FIG. 4-5 is shown in FIG. 6, where the first die 25 is shown as embedded within the first molding layer 24.

Figure 7:
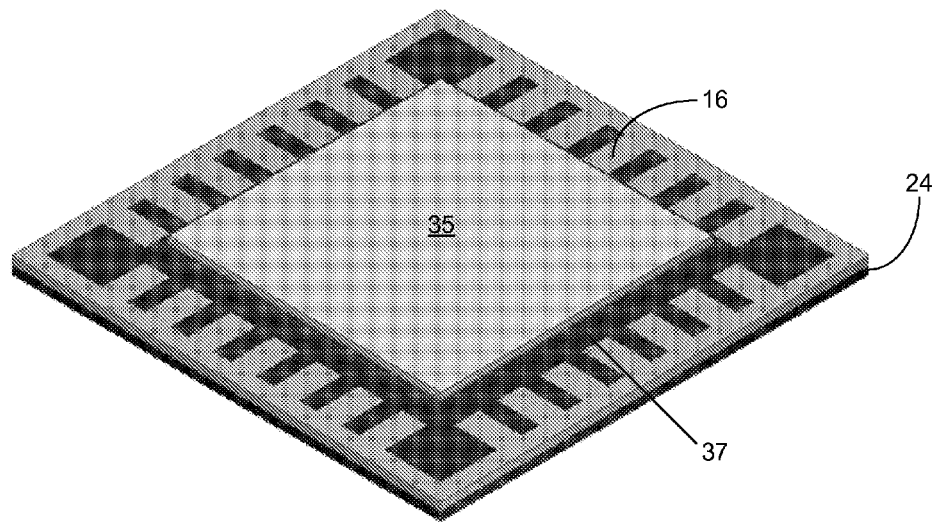
FIG. 7 depicts some embodiments of a method for making semiconductor packages containing a second die.

Next, as shown in FIG. 7, a second semiconductor die (or IC die) 35 can be attached to the first conductive vias 32 and the first molding layer 24. The second die 35 may be made of the same or different materials than those used in the first die 25. The second die 35 can contain any number of IC devices that may be the same or different than the device(s) used in the first die 25.

The second semiconductor die 35 can be attached to the first conductive vias 32 and the first molding layer 24 using any known flipchip process. Accordingly, similar to the first semiconductor die 25, bond pads can be formed on the desired locations of the IC die(s), and then second stud bumps (or pillars) 45 can be applied to the bonds pads. The die 35 is then flipped and attached so that these bond pads are attached to the desired locations of the conductive vias 32 through the second bumps 45. In the illustrated embodiments, an optional underfill process can be performed during or after the attachment of the second die 35 to form an underfill layer 37.

An encapsulation process can then be performed on the structure illustrated in FIG. 7 to form a second (or final) molding layer 44. The encapsulation process uses any molding material known in the art. In some embodiments, the molding material can comprise an epoxy molding compound, a thermoset resin, a thermoplastic material, or potting material. In other embodiments, the molding material comprises an epoxy molding compound. The second molding layer 44 does not encapsulate the components already encapsulated by the pre-molding layer 24. The second molding layer 44, however, can cooperate with this pre-molding layer 24 to encapsulate the desired components of the semiconductor package except for the bottom land pad array and the upper terminals that are formed by the second conductive vias (as described herein).

Figure 8:
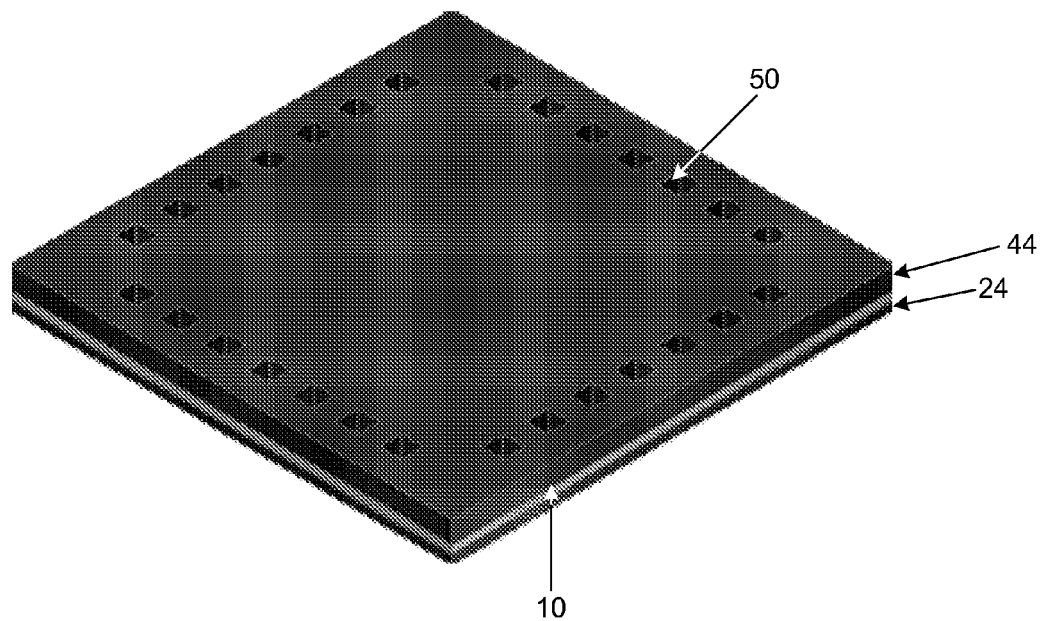
FIG. 8 depicts some embodiments of a method for making semiconductor packages containing a second molding layer containing second via holes.

During the process of forming the second molding layer 44, second via holes 50 can be provided by any process that provides the second via holes 50 in the desired locations. In the illustrated embodiments, the second via holes 50 are located in the periphery of the upper surface of the second molding layer 44, as shown in FIG. 8. In some embodiments, the second via holes 50 can be mold tool-defined and formed during the molding process when making the second molding layer 44. The mold tool can be designed and fabricated with embossed features in the mold cavity to form the second via holes 50. In other embodiments, the second via holes 50 can be provided after the second molding layer 44 is formed by using any process known in the art, such as laser drilling process and/or those processes described above.

Figure 9:
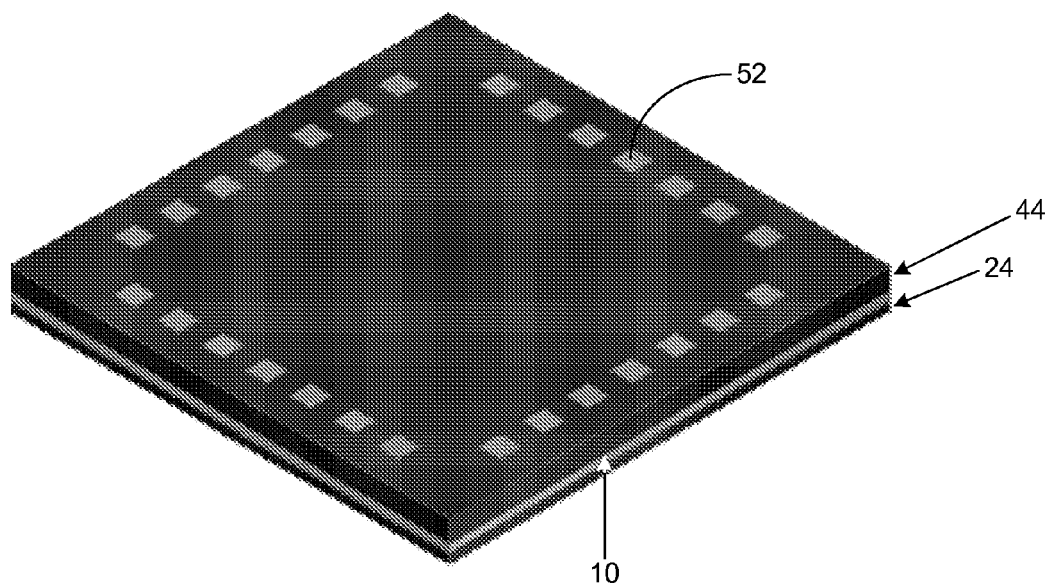
FIG. 9 depicts some embodiments of a method for making semiconductor packages containing second conductive vias in the second molding layer.

Next, the second via holes 50 can be filled as shown in FIG. 9. The second via holes 50 can be filled with any conductive material known in the art, including Ag, Sn, Pb, Cu, Sb, Au, or combinations thereof. The second via holes 50 can be filled using any process known in the art, including a deposition of the conductive material followed by a planarization process until the upper surface of the second molding layer 44 is reached. As shown in the top view depicted in FIG. 9, the resulting second conductive vias 52 have been created in the via holes 50 in the second molding layer 44. Optionally, a buffing process can be performed after the second conductive vias 52 have been formed. In the illustrated embodiments, the second conductive vias 52 are located on an upper surface of the completed semiconductor package and operate as an upper land array containing upper terminals for stacking of other semiconductor packages.

The process for making the semiconductor package continues when the tape 15 is removed. The tape 15 can be removed by any process that will not damage the structure that remains after its removal. In some embodiments, the removal process can be performed by peeling off the tape 15 using a tape remover machine with automatic handling system. The removal of the tape 15 leaves the pattern of the inner, middle, and outer terminals exposed on the bottom of the semiconductor package since the first and second molding layers do not encapsulate them. As well, the first and second molding layers do not encapsulate the side of the carrier frame 10 so that the ends of the carrier frame 10 are exposed.

Figure 10:
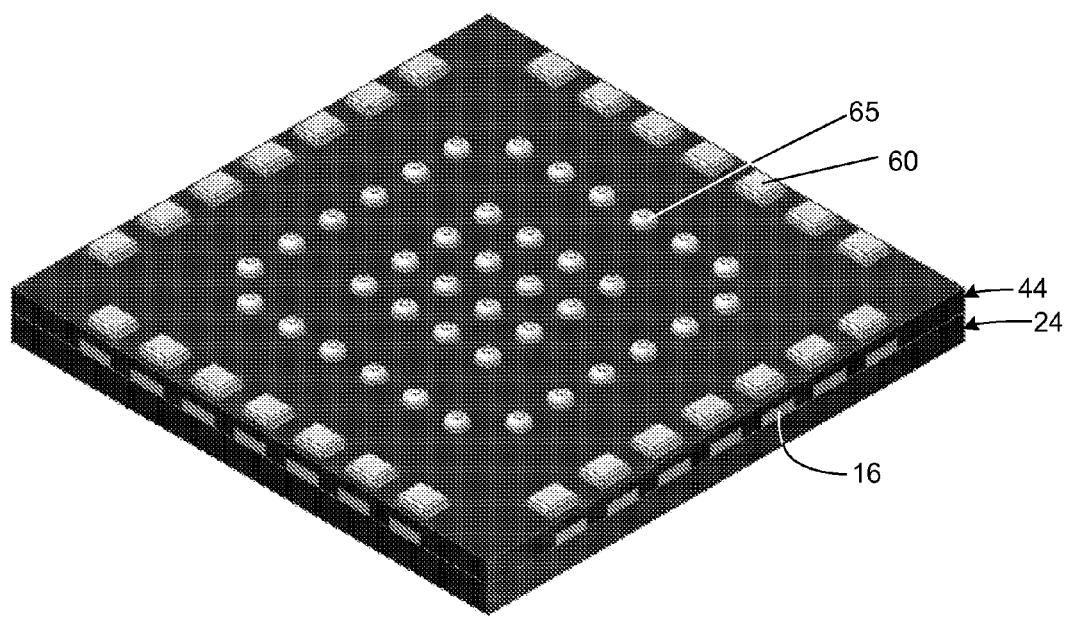
FIG. 10 depicts some embodiments of a method for making semiconductor packages containing solder connectors.

After removing the tape 15, the outer, middle, and inner terminals form an array of land pads or lands 55, as shown in FIG. 10. The land pads 55 can have any configuration or layout known in the art consistent with their operation in the semiconductor package. Thus, in the illustrated embodiments, the lands 55 can be given a substantially rectangular configuration. In other embodiments, though, the lands 55 can have a round or other suitable geometrical shape.

If desired, and as depicted in FIG. 10, some or all of the terminals can be provided with a solder connector. The solder connector(s) can be used in the connection of the semiconductor package to an external device (i.e., a printed circuit board) and, therefore, the specific solder connector can be selected with the specific external device in mind. In the illustrated embodiments in FIGS. 10-11, the solder connectors can comprise solder bumps 60. The solder bumps 60 can comprise any known solder material, such as Sn, Pb, Ag, Cu, Sb, Au, and can be formed using any known bumping process, including a dispensing or screen printing process. In other embodiments, the solder connectors can comprise solder balls 65 that are made of any known solder material (such as Sn, Pb, Ag, Cu, Sb, Au) that can be formed using any known process, including a solder ball drop or printing process.

The molded semiconductor package with the solder connectors can then be singulated. The singulation of the molded semiconductor package can be carried out using any process known in the art, including a saw singulation process or a water jet singulation process. Then, the singulated semiconductor packages may be electrically tested, taped, and reeled using any processes known in the art. The semiconductor packages can then be connected to a printed circuit board using the solder connectors and used in any electronic device known in the art such as portable computers, disk drives, USB controllers, portable audio devices, or any other portable/ultraportable electronic devices.

Figure 11:
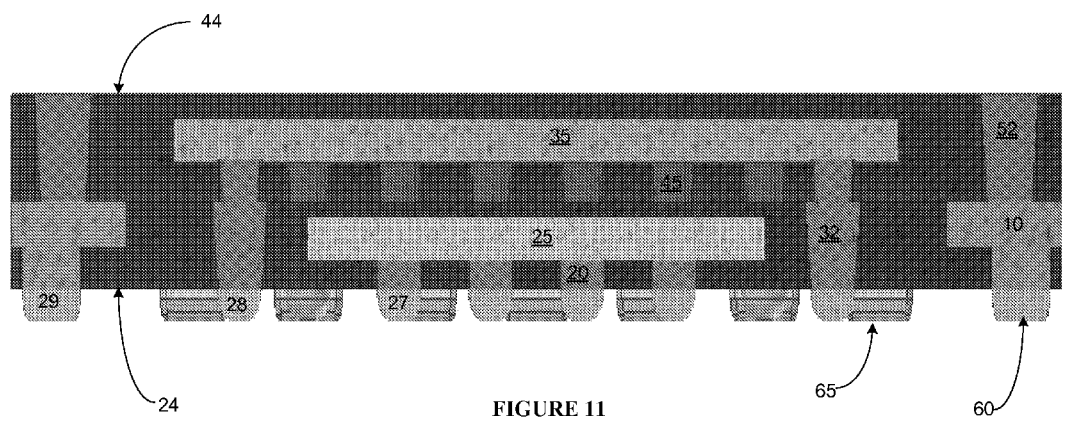
FIG. 11 depicts a side view of some embodiments of a completed semiconductor package.

The completed semiconductor package 100 is shown in the side view of FIG. 11. The package 100 contains the first semiconductor die 25 that is completely embedded within the first molding layer 24. The IC device(s) in the first semiconductor die 25 are connected to the first bumps 20 which form the inner terminals 27. The IC device(s) in the second semiconductor die 35 are connected to the second bumps 45 which are connected to first conductive vias 32 which form the middle terminals 28. The second conductive vias 52 are connected to the carrier frame 10 which forms the outer terminals 29 of the semiconductor package 100. The pattern of terminals on the bottom of the semiconductor package 100 (which can optionally have solder connectors formed on them) can be customized for a wide variety of land configurations. This allows the semiconductor package 100 to be configured with many different sizes and shapes and used with different die sizes and shapes.

In some embodiments, a modified semiconductor package could be made to contain a third semiconductor die (or more die). In these embodiments, the third die could be attached to the second conductive vias 52 and the second molding layer 44. The IC device(s) in the third semiconductor die could then be electrically connected to the second conductive vias 52 using third stud bumps. A third molding layer containing third conductive via holes could then be formed around the third die. The third conductive via holes could then be filled to form third conductive vias in the upper part of the modified semiconductor package.

The semiconductor packages formed by these methods have several features. First, the semiconductor packages contain a full array of land pads without using any leads or a leadframe. Second, the semiconductor packages contain a die-embedded, pre-molded substrate. Third, the semiconductor packages contain via holes that are formed during the molding process rather than having to use laser drilling process. Fourth, these packages contain multiple semiconductor dies that can be stacked on each other while also being relatively thin. These features provide a high input/output (I/O) capability, flexible routing capability, smaller package footprint, and a cost effective manufacturing solution.

In some embodiments, the semiconductor packages can be formed by a process comprising: providing a bottom land pad array comprising inner terminals, middle terminals, and outer terminals; providing a first die containing a first integrated circuit device embedded in a first molding layer containing first conductive vias, the first integrated circuit device connected to first stud bumps which form the inner terminals, wherein the bottom of the inner terminals are not encapsulated by the first molding layer; providing a second die containing a second integrated circuit device embedded in a second molding layer containing second conductive vias, the second integrated circuit device connected to second stud bumps which are connected to the first conductive vias which form the middle terminals, wherein the bottom of the middle terminals are not encapsulated by the first molding layer; and providing a carrier frame connected to the second conductive vias, wherein the bottom of the carrier frame forms the outer terminals and an upper surface of the second conductive vias form upper terminals, wherein the bottom of the outer terminals are not encapsulated by the first molding layer and wherein the sides of the carrier frame are not encapsulated by the first molding layer or the second molding layer.

In some embodiments, the semiconductor packages can be formed by a process comprising: forming a carrier frame with a substantially rectangular portion and an inner portion comprising members that extend inward from the outer portion, the members having an extended bottom portion; providing a tape on the bottom of the carrier frame; flip-chipping a first die containing a first integrated circuit device onto the tape, the first integrated circuit device containing first stud bumps; providing a first molding layer containing first via holes around the first die, wherein the surface of the first stud bumps contacting the tape are not encapsulated by the first molding layer; filling the first via holes with a conductive material to form first conductive vias; flip-chipping a second die containing a second integrated circuit device onto the first molding layer, wherein second stud bumps on the second integrated circuit device contact the first conductive vias; providing a second molding layer containing second via holes around the second die; filling the second via holes with a conductive material to form second conductive vias, wherein the upper surface of second conductive vias are not encapsulated by the first molding layer; and removing the tape from the carrier frame.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
    a bottom land pad array comprising inner terminals, middle terminals, and outer terminals;
    a first die containing a first integrated circuit device embedded in a first molding layer containing first conductive vias, the first integrated circuit device connected to first stud bumps which form the inner terminals, wherein the bottom of the inner terminals are not encapsulated by the first molding layer;
    a second die containing a second integrated circuit device embedded in a second molding layer containing second conductive vias, the second integrated circuit device connected to second stud bumps which are connected to the first conductive vias which form the middle terminals, wherein the bottom of the middle terminals are not encapsulated by the first molding layer; and
    a carrier frame connected to the second conductive vias, wherein the bottom of the carrier frame forms the outer terminals which are not encapsulated by the first molding layer and wherein the sides of the carrier frame are not encapsulated by the first molding layer or the second molding layer.

2. The semiconductor package of claim 1, wherein solder connectors are formed on the exposed parts of the inner, middle, and outer terminals that are not encapsulated.

3. The semiconductor package of claim 1, wherein the upper surface of the second conductive vias are not encapsulated by the first molding layer or the second molding layer.

4. The semiconductor package of claim 3, wherein an upper surface of the second conductive vias are exposed to form upper terminals.

5. The semiconductor package of claim 1, wherein the first molding layer and the second molding layer are formed separately.

6. The semiconductor package of claim 1, wherein the carrier frame comprises an outer, substantially rectangular portion.

7. The semiconductor package of claim 6, wherein the carrier frame comprises an inner portion comprising members that extend inward from the outer portion, the members having an extended bottom portion that form the outer terminals.

8. The semiconductor package of claim 1, wherein the outer terminals are isolated.

9. An electronic device containing a semiconductor package, comprising:
    a printed circuit board; and
    a semiconductor package comprising:
        a bottom land pad array comprising inner terminals, middle terminals, and outer terminals;
        a first die containing a first integrated circuit device embedded in a first molding layer containing first conductive vias, the first integrated circuit device connected to first stud bumps which form the inner terminals, wherein the bottom of the inner terminals are not encapsulated by the first molding layer;
        a second die containing a second integrated circuit device embedded in a second molding layer containing second conductive vias, the second integrated circuit device connected to second stud bumps which are connected to the first conductive vias which form the middle terminals, wherein the bottom of the middle terminals are not encapsulated by the first molding layer; and
        a carrier frame connected to the second conductive vias, wherein the bottom of the carrier frame forms the outer terminals which are not encapsulated by the first molding layer and wherein the sides of the carrier frame are not encapsulated by the first molding layer or the second molding layer.

10. The electronic device of claim 9, wherein solder connectors are formed on the exposed parts of the inner, middle, and outer terminals that are not encapsulated.

11. The electronic device of claim 9, wherein the upper surface of the second conductive vias are not encapsulated by the first molding layer or the second molding layer.

12. The electronic device of claim 11, wherein an upper surface of the second conductive vias are exposed to form upper terminals.

13. The electronic device of claim 9, wherein the first molding layer and the second molding layer are formed separately.

14. The electronic device of claim 9, wherein the carrier frame comprises an outer, substantially rectangular portion.

15. The electronic device of claim 14, wherein the carrier frame comprises an inner portion comprising members that extend inward from the outer portion, the members having an extended bottom portion that form the outer terminals.

16. The electronic device of claim 9, wherein the outer terminals are isolated.

17. A semiconductor package, comprising:
a bottom land pad array comprising inner terminals, middle terminals, and isolated outer terminals;
a first die containing a first integrated circuit device embedded in a first molding layer containing first conductive vias, the first integrated circuit device connected to first stud bumps which form the inner terminals, wherein the bottom of the inner terminals are not encapsulated by the first molding layer;
a second die containing a second integrated circuit device embedded in a second molding layer that is formed separate from the first molding layer and that contains second conductive vias, the second integrated circuit device connected to second stud bumps which are connected to the first conductive vias which form the middle terminals, wherein the bottom of the middle terminals are not encapsulated by the first molding layer; and
a carrier frame connected to the second conductive vias, wherein the bottom of the carrier frame forms the outer terminals and an upper surface of the second conductive vias form upper terminals that are not encapsulated by the first molding layer or the second molding layer, wherein the bottom of the outer terminals are not encapsulated by the first molding layer and wherein the sides of the carrier frame are not encapsulated by the first molding layer or the second molding layer.

18. The semiconductor package of claim 17, wherein solder connectors are formed on the exposed parts of the inner, middle, and outer terminals that are not encapsulated.

19. The semiconductor package of claim 17, wherein the first molding layer and the second molding layer are formed separately.

20. The semiconductor package of claim 17, wherein the carrier frame comprises an outer, substantially rectangular portion and an inner portion comprising members that extend inward from the outer portion, the members having an extended bottom portion that form the outer terminals.

* * * * *